(12) United States Patent  
Le Maitre et al.

(10) Patent No.: US 12,123,910 B2
(45) Date of Patent: Oct. 22, 2024

(54) OPTOELECTRONIC CHIP AND METHOD FOR TESTING PHOTONIC CIRCUITS OF SUCH CHIP

(71) Applicant: STMicroelectronics (Crolles 2) SAS, Crolles (FR)

(72) Inventors: Patrick Le Maitre, Biviers (FR); Jean-Francois Carpentier, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 125 days.

(21) Appl. No.: 18/146,543

(22) Filed: Dec. 27, 2022

(65) Prior Publication Data

US 2023/0136742 A1 May 4, 2023

Related U.S. Application Data

(63) Continuation of application No. 16/249,546, filed on Jan. 16, 2019, now Pat. No. 11,555,852.

(30) Foreign Application Priority Data

Feb. 13, 2018 (FR) ...................... 1851202

(51) Int. Cl.
*G01R 31/317* (2006.01)
*G01M 11/00* (2006.01)
*G02B 6/12* (2006.01)
*G02B 6/27* (2006.01)
*G02B 6/28* (2006.01)
(Continued)

(52) U.S. Cl.
CPC ....... *G01R 31/31728* (2013.01); *G01M 11/00* (2013.01); *G01M 11/332* (2013.01); *G01M 11/335* (2013.01); *G02B 6/12004* (2013.01); *G02B 6/2773* (2013.01); *G02B 6/2813* (2013.01); *G02B 6/29332* (2013.01);
(Continued)

(58) Field of Classification Search
CPC ...... G01M 11/00; G01M 11/30; G01M 11/33; G01M 11/331; G01M 11/332; G01M 11/333; G01M 11/334; G01M 11/335; G01M 11/336; G01M 11/337; G01M 11/338; G02B 6/12004; G02B 6/12011; G02B 6/12019; G02B 6/12033; G02B 6/2773; G02B 6/2813; G02B 6/2932; G02B 6/29331; G02B 6/29332; G02B 2006/12147; G01R 31/31728; G01R 31/381511; H01L 25/167; G02F 1/21; G02F 1/217; H04B 10/0731
See application file for complete search history.

(56) References Cited

U.S. PATENT DOCUMENTS 5,745,619 A 4/1998 Li et al.
5,896,193 A 4/1999 Colbourne et al.
(Continued)

FOREIGN PATENT DOCUMENTS

CA 2417790 A1 8/2003
CN 102201864 A 9/2011
(Continued)

*Primary Examiner* — Gordon J Stock, Jr.
(74) *Attorney, Agent, or Firm* — Slater Matsil, LLP

(57) ABSTRACT

An optoelectronic chip includes optical inputs having different passbands, a photonic circuit to be tested, and an optical coupling device configured to couple said inputs to the photonic circuit to be tested.

20 Claims, 4 Drawing Sheets

(51) Int. Cl.
  *G02B 6/293* (2006.01)
  *G02F 1/21* (2006.01)
  *H01L 25/16* (2023.01)
(52) U.S. Cl.
  CPC .............. *G02F 1/21* (2013.01); *G02F 1/217* (2021.01); *H01L 25/167* (2013.01); *G02B 2006/12147* (2013.01)

(56) References Cited

U.S. PATENT DOCUMENTS

| | | | |
|---|---|---|---|
| 6,043,887 A | 3/2000 | Allard et al. | |
| 6,091,870 A | 7/2000 | Eldada | |
| 6,147,757 A | 11/2000 | Shen et al. | |
| 6,784,984 B2* | 8/2004 | Parente | G01M 11/30 356/73.1 |
| 6,856,398 B2 | 2/2005 | Ruchet | |
| 6,882,428 B2 | 4/2005 | Baney et al. | |
| 6,943,891 B2 | 9/2005 | VanWiggeren | |
| 6,970,237 B1 | 11/2005 | Stolte | |
| 6,985,648 B2 | 1/2006 | Kish, Jr. et al. | |
| 7,006,719 B2 | 2/2006 | Joyner et al. | |
| 7,012,440 B2 | 3/2006 | Feng | |
| 7,043,109 B2 | 5/2006 | Kish, Jr. et al. | |
| 7,129,100 B2 | 10/2006 | Joyner et al. | |
| 7,236,682 B2 | 6/2007 | Lalonde | |
| 7,253,906 B2 | 8/2007 | Friessnegg et al. | |
| 7,529,436 B2 | 5/2009 | Joyner et al. | |
| 7,738,089 B2 | 6/2010 | Lange et al. | |
| 7,792,396 B2 | 9/2010 | Kish, Jr. et al. | |
| 8,786,843 B2 | 7/2014 | Chen | |
| 9,020,367 B2 | 4/2015 | Jones et al. | |
| 9,086,387 B2 | 7/2015 | Assefa et al. | |
| 9,234,854 B2* | 1/2016 | Assefa | G01N 21/9501 |
| 9,453,723 B1 | 9/2016 | LeMaitre et al. | |
| 9,791,346 B1 | 10/2017 | Carpentier et al. | |
| 9,829,659 B2* | 11/2017 | Chen | G02B 6/2852 |
| 10,042,131 B1 | 8/2018 | Lesea | |
| 10,088,299 B2* | 10/2018 | Tokushima | G02B 6/34 |
| 10,324,261 B2* | 6/2019 | Leijtens | G02B 6/4274 |
| 10,677,684 B2 | 6/2020 | Grosse et al. | |
| 10,921,370 B2 | 2/2021 | Le Maitre et al. | |
| 10,938,481 B2* | 3/2021 | Sugiyama | G01M 11/30 |
| 10,964,605 B1* | 3/2021 | Vermeulen | G02B 6/1223 |
| 10,998,974 B2* | 5/2021 | Sugiyama | H04B 10/40 |
| 11,022,522 B2* | 6/2021 | Piazza | G01M 11/0207 |
| 11,280,959 B2* | 3/2022 | Meade | H01L 22/30 |
| 11,409,036 B2* | 8/2022 | Novack | G02B 6/4206 |
| 11,555,852 B2* | 1/2023 | Le Maitre | G02B 6/29332 |
| 11,815,422 B2* | 11/2023 | Fukuda | G01M 11/33 |
| 2002/0149780 A1 | 10/2002 | Trinh | |
| 2003/0112442 A1 | 6/2003 | Baney et al. | |
| 2003/0184734 A1 | 10/2003 | Parente et al. | |
| 2003/0223672 A1 | 12/2003 | Joyner et al. | |
| 2004/0033004 A1 | 2/2004 | Welch et al. | |
| 2005/0030522 A1 | 2/2005 | Baney et al. | |
| 2005/0030544 A1 | 2/2005 | VanWiggeren et al. | |
| 2005/0062978 A1 | 3/2005 | Krause et al. | |
| 2005/0078315 A1 | 4/2005 | Ozeki et al. | |
| 2011/0273719 A1 | 11/2011 | Froggatt | |
| 2012/0106984 A1 | 5/2012 | Jones et al. | |
| 2013/0046499 A1 | 2/2013 | Minneman et al. | |
| 2014/0169740 A1 | 6/2014 | Verslegers et al. | |
| 2014/0336973 A1 | 11/2014 | Froggatt et al. | |
| 2016/0146873 A1 | 5/2016 | Su et al. | |
| 2016/0266005 A1 | 9/2016 | Bos | |
| 2017/0307687 A1 | 10/2017 | Grosse et al. | |
| 2019/0250212 A1 | 8/2019 | Le Maitre et al. | |
| 2019/0250213 A1 | 8/2019 | Le Maitre et al. | |
| 2020/0232878 A1* | 7/2020 | Ma | G01M 11/331 |
| 2022/0057584 A1* | 2/2022 | Miura | G02B 6/12 |

FOREIGN PATENT DOCUMENTS

| | | |
|---|---|---|
| CN | 102396196 A | 3/2012 |
| CN | 203116945 U | 8/2013 |
| CN | 209471277 U | 10/2019 |
| CN | 209728245 U | 12/2019 |
| EP | 1392011 A2 | 2/2004 |
| EP | 1505749 A1 | 2/2005 |
| TW | 451073 B | 8/2001 |
| WO | 2017048832 A1 | 3/2017 |

* cited by examiner

OPTOELECTRONIC CHIP AND METHOD FOR TESTING PHOTONIC CIRCUITS OF SUCH CHIP

CROSS-REFERENCE TO RELATED APPLICATIONS

This application is a continuation of U.S. application Ser. No. 16/249,546, filed on Jan. 16, 2019, application claims the priority benefit of French patent application number 18/51202, filed on Feb. 13, 2018, which applications are hereby incorporated herein by their reference.

TECHNICAL FIELD

The present disclosure generally relates to optoelectronic chips, and more particularly to the testing of photonic (that is, optical or optoelectronic) circuits of such chips.

BACKGROUND

To make sure that photonic circuits of a chip are functional, the latter are tested or characterized. For this purpose, an optical signal injected at the level of an optical input of the chip is supplied to a circuit to be tested. An output signal of the circuit is then observed to determine whether the circuit is functional.

SUMMARY

In accordance with an embodiment of the present invention, an optoelectronic chip comprises optical inputs having different passbands, a photonic circuit to be tested, and an optical coupling device configured to couple the optical inputs to the photonic circuit to be tested.

In accordance with an embodiment of the present invention, an optoelectronic chip comprises a first pair of optical inputs comprising a first input and a second input, where the first and the second inputs are each adapted to a different wavelength. The chip also includes a photonic circuit to be tested; and a first optical coupling device configured to couple the first pair of optical inputs to the photonic circuit to be tested.

In accordance with an embodiment of the present invention, a method of testing an optoelectronic chip comprises providing an optoelectronic chip comprising optical inputs having different passbands, a photonic circuit to be tested, and an optical coupling device configured to couple the optical inputs to the photonic circuit to be tested. At a first input of the optical inputs, a first signal is supplied at a first wavelength in the passband of the first input, and coupling the first signal to the photonic circuit to be tested through the optical coupling device. At a second input of the optical inputs, a second signal is supplied at a different second wavelength in the passband of the second input, and coupling the second signal to the photonic circuit to be tested through the optical coupling device.

DETAILED DESCRIPTION OF ILLUSTRATIVE EMBODIMENTS

Figure 1:
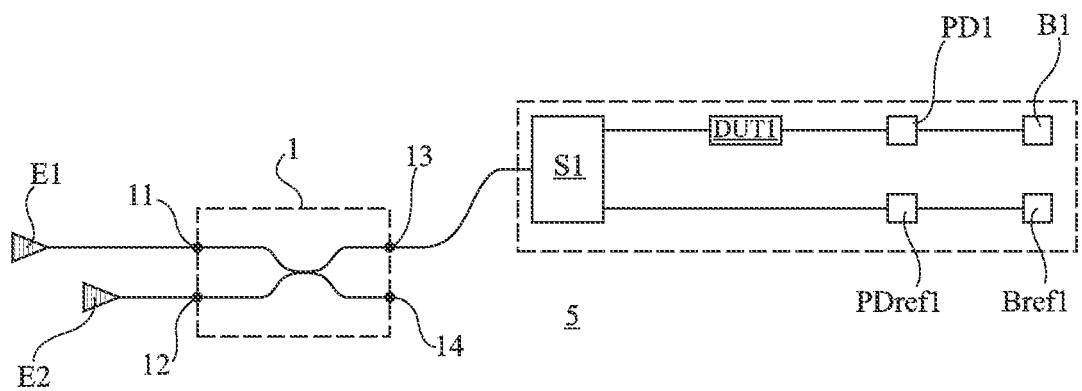
FIG. 1 is a partial simplified top view illustrating an embodiment of an optoelectronic chip according to a first aspect, the chip comprising photonic circuits to be tested.

It would be desirable to have a device for testing circuits of an optoelectronic chip which overcomes at least some of the disadvantages of known test devices, particularly which enables to test one or a plurality of circuits of the chip at different wavelengths, in particular over a wide wavelength range, and/or for different polarization modes, that is, electric transverse and magnetic transverse.

It would also be desirable to have a method of testing photonic circuits of an optoelectronic chip which overcomes at least certain disadvantages of known test methods, particularly which enables to test such circuits at different wavelengths, for example, over a wide wavelength range, and/or for different polarization modes.

Thus, according to a first aspect, an embodiment provides an optoelectronic chip comprising optical inputs having different passbands, at least one photonic circuit to be tested, and an optical coupling device configured to couple said inputs to the circuit to be tested.

According to an embodiment, the device is configured to provide, when an input of the chip receives a signal at a wavelength in the passband of this input, a signal of same wavelength to the circuit to be tested.

According to an embodiment, the device comprises at least one optical coupler.

According to an embodiment, each optical coupler is of multimode interferometer type.

According to an embodiment, each optical coupler is an evanescent coupler.

According to an embodiment, the device comprises at least one optical coupler of multimode interferometer type, and at least one evanescent coupler.

According to an embodiment, each evanescent coupler has two inputs and two outputs.

According to an embodiment, the device comprises at least one optical splitter having an input coupled to the inputs of the chip and having an output coupled to the photonic circuit to be tested.

According to an embodiment, the different passbands are adjacent.

According to an embodiment, the chip comprises, for each of said different passbands, two optical inputs having this passband and being each adapted to a different polarization, the coupling device being configured to couple said two optical inputs to the circuit to be tested.

According to an embodiment, the device is configured to provide, when an input of the chip receives a polarization signal adapted to this input, at a wavelength in the passband of this input, a signal of same wavelength and of same polarization to the circuit to be tested.

Another embodiment according to the first aspect provides a method of testing a chip such as defined hereabove, comprising, for each input of the chip, supplying to said input a signal at a wavelength in the passband of said input of the chip.

According to an embodiment, the signal supplied to the input of the chip is at the polarization to which said input of the chip is adapted.

According to an embodiment, the signal is supplied to said input of the chip by means of an optical fiber, the method comprising a step of aligning one end of said optical fiber with said input of the chip.

According to an embodiment, said fiber belongs to an array of optical fibers held in place in a support and, on alignment of said end of said optical fiber, ends of other optical fibers of the array are aligned with other inputs of the chip.

According to a second aspect, an embodiment provides an optoelectronic chip comprising a pair of optical inputs having a same passband and each of which is adapted to a different polarization, at least one photonic circuit to be tested, and an optical coupling device configured to couple the two inputs to the circuit to be tested.

According to an embodiment, the device is configured to provide, when an input of the chip receives a polarization signal adapted to this input, at a wavelength in the passband of this input, a signal of same wavelength and of same polarization to the circuit to be tested.

According to an embodiment, each optical coupler is of multimode interferometer type.

According to an embodiment, the device comprises at least one optical coupler.

According to an embodiment, each optical coupler is an evanescent coupler.

According to an embodiment, the device comprises at least one optical coupler of multimode interferometer type, and at least one evanescent coupler.

According to an embodiment, each evanescent coupler has two inputs and two outputs.

According to an embodiment, the device comprises at least one optical splitter having an input coupled to the inputs of the chip and having an output coupled to the photonic circuit to be tested.

According to an embodiment, the different passbands are adjacent.

According to an embodiment, the chip comprises a plurality of optical input pairs, the optical inputs of each pair being each adapted to a different polarization and having a same passband different from those of the other pairs of optical inputs.

Another embodiment according to the second aspect provides a method of testing a chip such as defined hereabove, comprising, for each input of the chip, supplying to said input of the chip a polarization signal adapted to said input of the chip, at a wavelength in the passband of said input of the chip.

According to an embodiment, the signal is supplied to said input of the chip by means of an optical fiber, the method comprising a step of aligning one end of said optical fiber with said input of the chip.

According to an embodiment, said fiber belongs to an array of optical fibers held in place in a support and, on alignment of said end of said optical fiber, ends of other optical fibers of the array are aligned with other ends of the chip.

The foregoing and other features and advantages will be discussed in detail in the following non-limiting description of specific embodiments in connection with the accompanying drawings.

The same elements have been designated with the same reference numerals in the various drawings and, further, the various drawings are not to scale. For clarity, only those steps and elements which are useful to the understanding of the described embodiments have been shown and are detailed. In particular, the photonic circuits to be tested and their operation have not been detailed, the described embodiments being compatible with usual photonic circuits. Further, the usual components or photonic elements of optoelectronic chips (waveguides, photodiodes, grating couplers, couplers, splitters, . . . ) and the optical fibers currently used to test an optoelectronic chip have not been detailed, the described embodiments being compatible with such elements and such optical fibers.

The terms "approximately", "substantially", and "in the order of" are used herein to designate a tolerance of plus or minus 10%, preferably of plus or minus 5%, of the value in question.

Unless otherwise specified, when reference is made to two photonic elements connected together, this means that the elements are directly connected with no intermediate element other than waveguides, and when reference is made to two photonic elements coupled together, this means that the two elements may be directly coupled (connected) or coupled via one or a plurality of other elements.

FIGS. 1 to 5 illustrate a first aspect of the present description corresponding to the case where the circuits of an optoelectronic chip are tested for different wavelengths.

FIG. 1 is a partial simplified top view illustrating an embodiment of an optoelectronic chip 5 comprising one or a plurality of integrated photonic circuits to be tested.

Chip 5 comprises an optical coupling device 1, here an evanescent coupler using the near field radiation properties of the waveguides to achieve a coupling between two waveguides, part of the power of an optical signal in one of the two waveguides being transmitted, by radiation, into the other one of the waveguides at the level of parallel portions sufficiently close to the two waveguides. Here, evanescent coupler 1 has two inputs 11 and 12 and two outputs 13 and 14, and is currently called X coupler. Inputs 11 and 12 of coupler 1 are connected to respective grating couplers E1 and E2, each corresponding to an optical input of chip 5. Grating couplers E1 and E2 are adapted to respective wavelengths λ1 and λ2 different from each other. In practice, a grating coupler is designed to receive an optical signal having a given wavelength and typically has a narrow bandwidth around this wavelength, for example, a bandwidth at −3 dB in the range from 20 to 25 nm. In the present description, an optical input of chip 5 is said to be adapted to a wavelength when the passband of this input is centered on this single wavelength, a wavelength being said to be adapted to an input when it is within the passband of this input.

One of the outputs (for example, 13) of coupler 1 is coupled to an input of a photonic circuit to be tested DUT1 of chip 5, in this example, via an optical splitter S1. In the shown example, the other output of coupler 1, here output 14, is neither connected, nor coupled to a circuit to be tested. As a variation, each output of the coupler may be coupled to a different circuit to be tested.

In the example of FIG. 1, circuit DUT1 is an optical circuit with one input and one output. Optical splitter S1 having its input coupled, preferably connected, to output 13 of coupler 1, comprises an output coupled, preferably connected, to the input of circuit DUT1, and an output coupled, preferably connected, to a photodiode PDref1. Splitter S1 is configured to supply, at each of its outputs, a signal at the wavelength of the signal received on its input. Optical splitter S1 is calibrated, that is, the percentage of the power of the signal received on its input which is transmitted to each of its outputs is known, for example, to within 5%, preferably to within 1%. Preferably, this percentage is the same, for example, to within 5%, preferably to within 1%, for each output of optical splitter S1, which is then said to be balanced. A photodiode PD1, preferably identical to photodiode PDref1, is coupled, preferably connected, to the output of circuit DUT1. Each of photodiodes PD1 and PDref1 is configured to convert the optical signal that it receives into an electric signal supplied at a terminal, respectively B1 or Bref1. The assembly of optical splitter S1, of circuit DUT1, of photodiodes PD1 and PDref1, and of terminals B1 and Bref1 here forms a test chain (delimited by dotted lines in FIG. 1).

In a first phase of testing circuit DUT1, a signal of wavelength $\lambda 1$ adapted to input E1 is applied thereto, typically by means of an optical fiber having one end aligned with input E1, and having its other end coupled to a source of a light signal of wavelength $\lambda 1$. A signal of wavelength $\lambda 1$ is then transmitted to the circuit to be tested DUT1 via coupler 1. The output signal of the circuit is then observed to determine whether the circuit is functional at wavelength $\lambda 1$.

More particularly, in the shown example, coupler 1 supplies a signal of wavelength $\lambda 1$ to optical splitter S1, which then supplies a first signal of wavelength $\lambda 1$ to circuit DUT1, and a second signal of wavelength $\lambda 1$ to photodiode PDref1. The electric signals available on terminals B1 and Bref1, for example the currents measured at the level of these terminals, are then compared to characterize the operation of circuit DUT1 at wavelength $\lambda 1$, for example, to determine losses in circuit DUT1 at wavelength $\lambda 1$.

During a second test phase, similar to the first one, a signal of wavelength $\lambda 2$ adapted to input E2 is applied thereto. A test signal of wavelength $\lambda 2$ is then transmitted to the circuit to be tested DUT1 via coupler 1, the output signal of the circuit being observed to determine whether the circuit is functional at wavelength $\lambda 2$.

More particularly, in the shown example, coupler 1 supplies a signal of wavelength $\lambda 2$ to optical splitter S1, which supplies a first signal of wavelength $\lambda 2$ to circuit DUT1, and a second signal of wavelength $\lambda 2$ to photodiode PDref1. The electric signals available on terminals B1 and Bref1 are then compared to characterize the operation of circuit DUT1 at wavelength $\lambda 2$.

At the end of the two test phases, circuit DUT1 has been tested or characterized for wavelengths $\lambda 1$ and $\lambda 2$.

It could then have been devised to couple, without coupler 1, input E1 to a first test chain to test a circuit DUT1 at wavelength $\lambda 1$, and input E2 to a second test chain to test a circuit DUT1 at wavelength $\lambda 2$. An advantage of the solution of FIG. 1 however is that the necessary surface area of chip 5 is decreased.

Further, the provision of a plurality of circuits DUT1 would not have enabled to take into account possible manufacturing dispersions between circuits DUT1, and/or between the test chains comprising such circuits DUT1.

Figure 2:
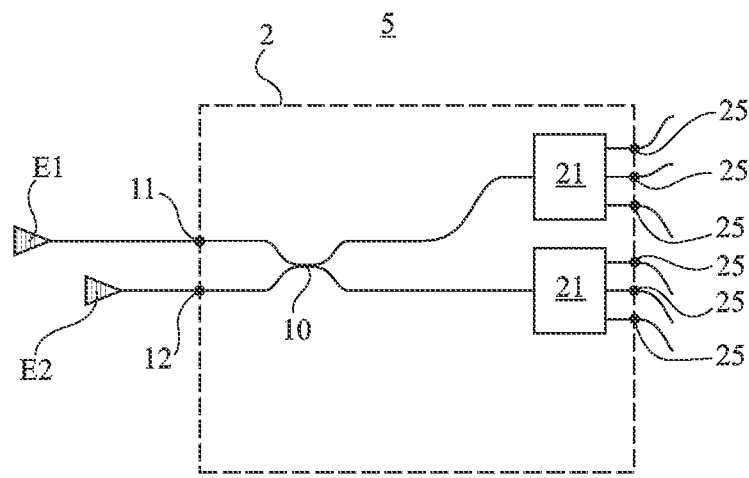
FIG. 2 is a partial simplified top view illustrating another embodiment of the chip of FIG. 1.

FIG. 2 is a partial simplified top view illustrating another embodiment of optoelectronic chip 5 described in relation with FIG. 1.

Unlike coupling device 1 of FIG. 1, optical coupling device 2 of FIG. 2 comprises an evanescent X coupler 10 having its inputs 11 and 12 respectively connected to inputs E1 and E2 of chip 5 and having at least one of its outputs, in the shown example, each output of coupler 10, connected to an optical splitter 21 having one input and a plurality of outputs, for example, three outputs. Optical splitters 21 need neither be calibrated, nor balanced, and may comprise a different number of outputs. Each output of each optical splitter 21 then corresponds to an output 25 of device 2 and supplies a signal at wavelength $\lambda 1$ or $\lambda 2$ when the input, respectively E1 or E2, receives a signal at this wavelength. Device 2, due to the splitters 21 that it comprises, has more outputs than device 1 of FIG. 1 and thus enables to simultaneously test or characterize a larger number of photonic circuits of chip 5.

Figure 3:
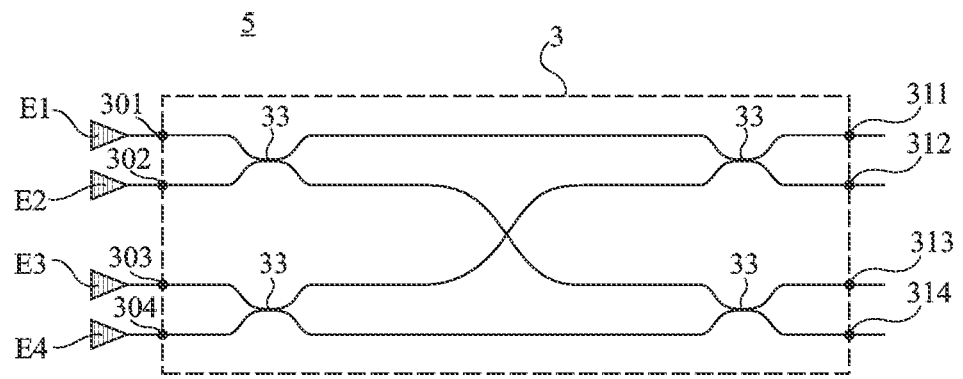
FIG. 3 is a partial simplified top view illustrating an alternative embodiment of the chip of FIG. 1.

FIG. 3 is a partial simplified top view illustrating an alternative embodiment of optoelectronic chip 5 described in relation with FIG. 1. In this variation, photonic circuits of chip 5 are desired to be tested for different wavelengths $\lambda i$, i being an integer in the range from 1 to N, N being equal to 4 in this example. Chip 5 then comprises N grating couplers defining N inputs Ei of chip 5, each of which is adapted to a different wavelength $\lambda i$.

Unlike coupling devices 1 and 2 of FIGS. 1 and 2, optical coupling device 3 of FIG. 3 comprises N inputs $30i$ connected to respective inputs Ei. Further, device 3 comprises M outputs $31j$, j being an integer in the range from 1 to M, M being equal to four in this example. Outputs $31j$ are coupled, for example connected, to different circuits to be tested (not shown) and/or to different test chains (not shown).

Device 3 comprises at least one optical coupler coupling each input $30i$ to each of outputs $31j$. Thus, by successively applying to each input Ei of the chip an optical signal of adapted wavelength $\lambda i$, a circuit coupled, for example, connected, to an output $31j$ of device 3 successively receives a signal at each of wavelengths $\lambda i$. Observing an output signal of the circuit, for each signal of wavelength $\lambda i$ received by the circuit, enables to determine whether the circuit is functional at each wavelength $\lambda i$.

In the shown example, device 3 comprises four evanescent X couplers 33. The inputs of a first coupler 33 are respectively coupled, preferably connected, to inputs 301 and 302, the inputs of a second coupler 33 being respectively coupled, preferably connected, to inputs 303 and 304. The two outputs of first coupler 33 are respectively coupled, preferably connected, to an input of a third coupler 33 and to an input of a fourth coupler 33. Similarly, the two outputs of second coupler 33 are respectively coupled, preferably connected, to the other input of third coupler 33 and to the other input of fourth coupler 33. Each of the outputs of the third and fourth couplers 33 is coupled, for example, connected, to a different output $31j$.

As shown in FIG. 3, waveguides of device 3 may cross. Preferably, such a crossing is implemented with the device described in article "Ultralow loss single layer submicron silicon waveguide crossing for SOI optical interconnect" of Yangjin Ma, published in 2016 in Optic Express. This enables to limit losses and interference due to the crossing of the waveguides, while limiting the necessary surface area of chip 5.

Device 3 may be adapted to the case where chip 5 comprises less than four inputs and/or outputs, for example, by not connecting some of the inputs/outputs. The alternative embodiment of FIG. 3 further applies to the embodiment of FIG. 2.

Figure 4:
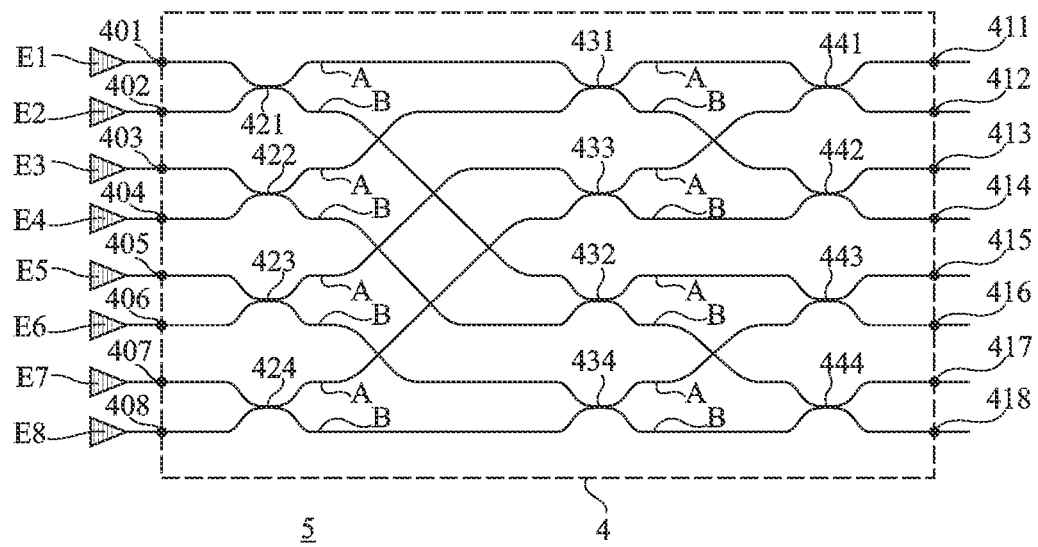
FIG. 4 is a partial simplified top view illustrating another alternative embodiment of the chip of FIG. 1.

FIG. 4 is a partial simplified top view illustrating another alternative embodiment of optoelectronic chip 5 described in relation with FIG. 1. In this variation, photonic circuits are desired to be tested for different wavelengths λi, i being an integer in the range from 1 to N, N being equal to eight in this example. Chip 5 then comprises N inputs Ei, for example defined by grating couplers, each of which is adapted to a different wavelength λi.

Unlike coupling devices 1, 2, and 3 of FIGS. 1, 2, and 3, optical coupling device 4 of FIG. 4 comprises N inputs 40i connected to respective inputs Ei. Further, device 3 comprises M outputs 41j, j being an integer in the range from 1 to M, M being equal to eight in this example. Outputs 41j are coupled, for example, connected, to different circuits to be tested (not shown) and/or to different test chains (not shown).

Device 4 comprises at least one optical coupler coupling each input 40i to each of outputs 41j. The operation of device 4 is similar to that of previously-described devices 1, 2, and 3.

In the shown example, device 4 comprises twelve evanescent X couplers distributed in three groups of four couplers, that is, one group of four couplers 421, 422, 423, and 424 having its inputs respectively coupled, preferably connected, to inputs Ei, one group of four couplers 441, 442, 443, and 444 having its outputs respectively coupled, preferably connected, to outputs 40j, and one group of four couplers 431, 432, 433, and 434 coupling the outputs of couplers 421, 422, 423, and 424 to the inputs of couplers 441, 442, 443, and 444. The respective outputs of each coupler are here designated with A and B. Couplers 421 and 422 have their A outputs coupled, preferably connected, to the inputs of coupler 431, their B outputs being coupled, preferably connected, to the inputs of coupler 432. Couplers 423 and 424 have their A outputs coupled, preferably connected, to the inputs of coupler 433, their B outputs being coupled, preferably connected, to the inputs of coupler 434. Couplers 431 and 433 have their A outputs coupled, preferably connected, to the inputs of coupler 443, their B outputs being coupled, preferably connected, to the inputs of coupler 444.

Device 4 may comprise, like device 3 of FIG. 3, waveguides crossing one another. Such waveguide crossings are for example implemented identically to what is described in relation with FIG. 3.

Device 4 may be adapted to the case where chip 5 comprises less than eight inputs and/or outputs. The alternative embodiment of FIG. 4 further applies to the embodiment of FIG. 2.

Figure 5:
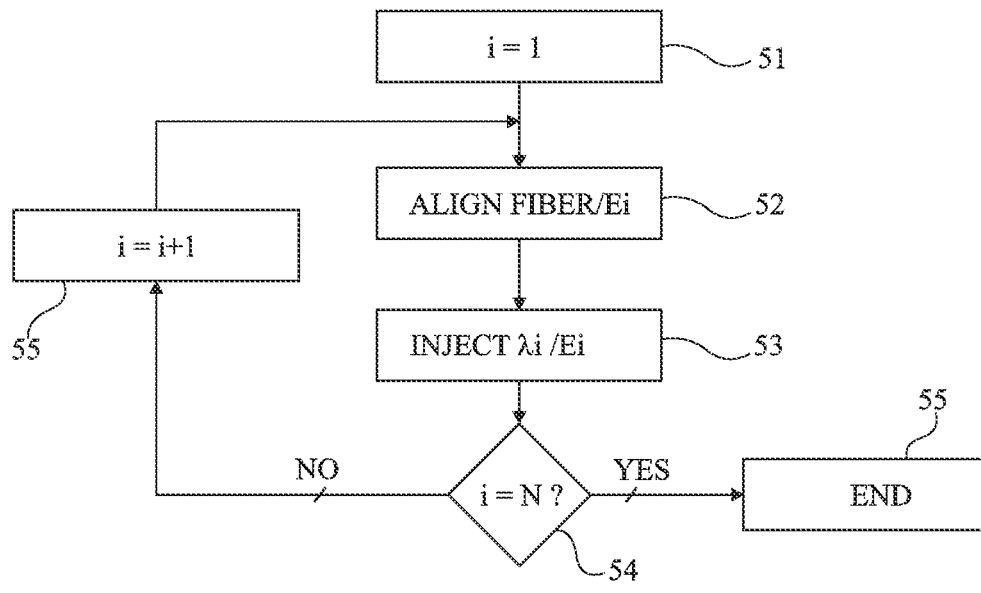
FIG. 5 is a flowchart illustrating an embodiment of a method of testing photonic circuits of a chip of the type in FIGS. 1 to 4.

FIG. 5 is a flowchart illustrating an embodiment of a method of testing an optoelectronic chip 5 for N different wavelengths. Chip 5 then comprises N inputs Ei and one coupling device of the type previously described, with at least N inputs.

At a state 51 (block i=1), for example, the initial state of the method, a loop variable i is initialized, for example, to 1.

At a next state 52 (block ALIGN FIBER/Ei), the end of an optical fiber, having its other end coupled to a light source of wavelength λi, is aligned with the input Ei adapted to wavelength λi.

At a next state 53 (block INJECT λi/Ei), a signal of wavelength λi is applied to input Ei. Each circuit to be tested, coupled or connected to an output of the coupling device, then receives a signal at wavelength λi and can thus be tested or characterized at this wavelength.

At a next state 54 (block i=N?), it is tested whether variable i is or not equal to N. This amounts to verifying whether the circuits have been tested for each of wavelengths λi, with i ranging from 1 to N. In other words, it is verified whether each input Ei of the chip has received a signal at the wavelength λi adapted to this input. It has if variable i is equal to N (output YES of block 54) and the next state 55 (block END) then corresponds to the end of the process. At state 55, the data collected during the test, for example, currents measured from terminals of test chains, may be compiled. However, if variable i is different from N (output NO of block 54), at a next state 56 (block i=i+1), loop variable i is incremented by one, the method carrying on at state 52.

The above method is for example implemented when a single optical fiber is selectively coupled, for example, with an optical switch, to one or a plurality of light sources supplying signals of different wavelengths λi, for example, to N light sources each supplying a different wavelength λi. The end of the fiber intended to be aligned with inputs Ei is then offset to be aligned with a different input Ei for each loop 52, 53, 54, and 56. This fiber may for example belong to an array of optical fibers held in place in a support block. In this case, the entire block is displaced at each loop.

In an alternative embodiment, not shown, an array of optical fibers held in place in a support block is provided, the spacing between fibers being the same as that between optical inputs Ei of the chip so that a plurality of fibers are simultaneously aligned with a plurality of inputs Ei. In each fiber of the array aligned with an input Ei, a signal having a wavelength adapted to this input Ei is injected, for example, by means of one or a plurality of light sources and, possibly, of an optical switch. The optical signals are successively injected into the fibers of the array so that a single input Ei at a time receives an optical signal at a wavelength adapted to this input.

For a same number N of inputs Ei, this alternative embodiment comprises less steps of alignment of fiber ends than the method of FIG. 5.

It has been considered up to now that inputs Ei of chip 5 are each adapted to a different wavelength λi. In practice, each optical input Ei of chip 5 may also be designed to receive a signal having a specific polarization mode, that is, an electric transverse or a magnetic transverse mode, the input being then said to be adapted to this polarization. For example, all the inputs Ei described hereabove may be adapted to a given polarization, for example identical for all inputs, preferably electric transverse.

As an example, the optical fibers used to provide the signals to the inputs of chip 5 are monomode fibers.

Figure 6:
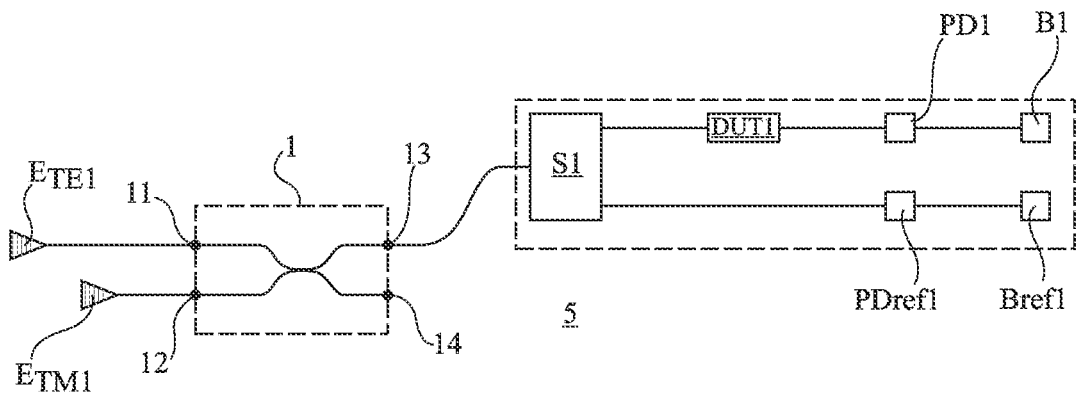
FIG. 6 is a partial simplified top view illustrating an embodiment of an optoelectronic chip according to a second aspect, the chip comprising one or a plurality of integrated photonic circuits to be tested.
Figure 7:
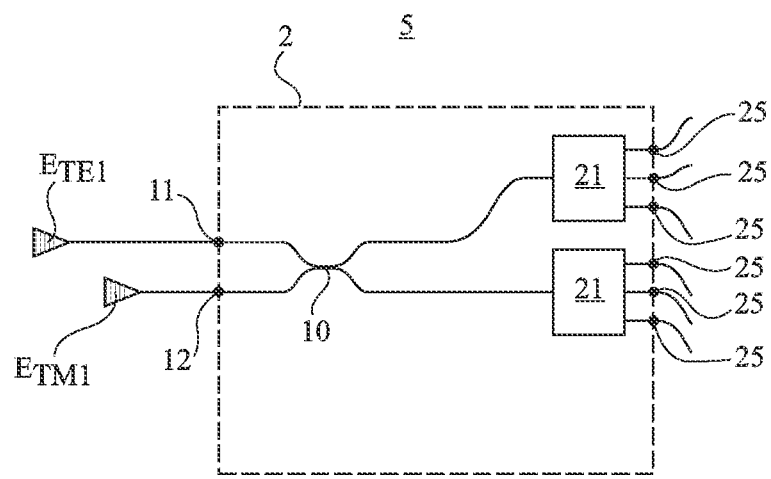
FIG. 7 is a partial simplified top view illustrating another embodiment of the chip of FIG. 6.
Figure 8:
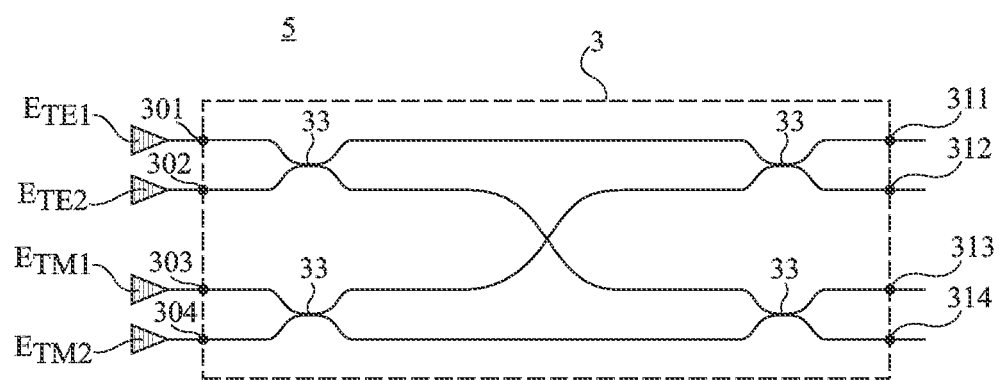
FIG. 8 is a partial simplified top view illustrating an alternative embodiment of the chip of FIG. 6.

FIGS. 6 to 8 illustrate a second aspect of the present description corresponding to the case where the circuits of an optoelectronic chip are tested for different polarization modes. In the following description, $E_{TEi}$ designates an input of chip 5 adapted to a given wavelength λi and to an electric transverse polarization, and $E_{TMi}$ designates an input of chip 5 adapted to wavelength λi and to a magnetic transverse polarization.

FIG. 6 is a partial simplified top view illustrating an embodiment of an optoelectronic chip 5 comprising one or a plurality of integrated photonic circuits to be tested.

In this embodiment, chip 5 comprises the same elements as chip 5 of FIG. 1, designated with the same reference numerals and coupled or connected together in the same way as in FIG. 1, with the difference that inputs E1 and E2 of chip 5 are here replaced with respective inputs $E_{TE1}$ and $E_{TM1}$, for example of the grating couplers. Further, coupling device 1 and optical splitter S1 are polarization-maintaining. In other words, when coupler 1 receives on one of its inputs 11 or 12 an optical signal of given polarization (electric transverse or magnetic transverse) and at a given wavelength, each of its outputs 13 and 14 provides an optical signal having the same polarization and the same wavelength as the received signal. Similarly, splitter S1 is configured to provide, at each of its outputs, a signal of same wavelength and of same polarization (electric transverse or magnetic transverse) as those of the signal received by its input. As for the embodiment of FIG. 1, optical splitter S1 is calibrated, preferably balanced.

During a first phase of testing circuit DUT1, a signal adapted to input $E_{TE1}$, here a signal of electric transverse polarization and at wavelength $\lambda 1$, is applied to input $E_{TE1}$. This signal is typically provided to input $E_{TE1}$ by means of a polarization-maintaining optical fiber having one end aligned with input $E_{TE1}$, and having its other end coupled to a source of an electric transverse polarization light signal of wavelength $\lambda 1$. A corresponding test signal having the same polarization and the same wavelength is then transmitted to the circuit to be tested DUT1 via coupling device 1. The output signal of the circuit is then observed to determine whether the circuit is functional for the electric transverse polarization, at wavelength $\lambda 1$.

During a second test phase, similar to the first one, a magnetic transverse polarization signal at wavelength $\lambda 1$ is supplied to input $E_{TM1}$. A corresponding test signal is then transmitted to the circuit to be tested DUT1 via coupling device 1, the output signal of the circuit being observed to determine whether the circuit is functional for the magnetic transverse polarization, at wavelength $\lambda 1$.

At the end of the two test phases, circuit DUT1 has been tested and characterized for each of the electric transverse and magnetic transverse polarizations, at wavelength $\lambda 1$.

FIG. 7 is a partial simplified top view illustrating another embodiment of the optoelectronic chip 5 described in relation with FIG. 6.

Chip 5 comprises the same elements as chip 5 of FIG. 2, designated with the same reference numerals and coupled or connected together in the same way as in FIG. 2, with the difference that inputs E1 and E2 of chip 5 are here replaced with respective inputs $E_{TE1}$ and $E_{TM1}$, for example, grating couplers. Further, coupling device is a polarization-maintaining device, in other words, coupler 10 and optical splitters 21 are polarization maintaining.

Thus, each output 25 of device 2 provides an electric transverse or magnetic transverse polarization signal, at wavelength $\lambda 1$, the input, respectively $E_{TE1}$ or $E_{TM1}$, receives a signal at this polarization and at this wavelength.

FIG. 8 is a partial simplified top view illustrating another alternative embodiment of the optoelectronic chip 5 described in relation with FIG. 6.

This embodiment benefits from the advantages previously described in relation with FIG. 2.

Chip 5 comprises the same elements as chip 5 of FIG. 3, designated with the same reference numerals and coupled or connected together in the same way as in FIG. 3, with the difference that inputs E1, E2, E3, and E4 of chip 5 are here replaced with respective inputs $E_{TE1}$, $E_{TE2}$, $E_{TM1}$, and $E_{TM2}$, for example, grating couplers. Further, coupling device 3 is a polarization-maintaining device, in other words, couplers 33 and the guide crossing device are polarization-maintaining.

By successively applying to each input $E_{TE1}$, $E_{TE2}$, $E_{TM1}$ et $E_{TM2}$ an optical signal having a polarization and a wavelength adapted to this input, a circuit coupled, for example, connected, to an output $31j$ of device 3 successively receives an electric transverse polarization signal at wavelength $\lambda 1$ and then $\lambda 2$, and a magnetic transverse polarization signal at wavelength $\lambda 1$ and then $\lambda 2$. Observing an output signal of the circuit, for each signal received by the circuit, enables to determine whether the circuit is functional for each of the electric transverse and magnetic transverse polarizations, at wavelengths $\lambda 1$ and $\lambda 2$.

Device 3 may be adapted to the case where chip 5 comprises less than four outputs. The alternative embodiment described in relation with FIG. 8 further applies to the embodiment of FIG. 7.

According to an alternative embodiment, not shown, similarly to what has been described in relation with FIG. 8, chip 5 of FIG. 4 may be adapted to the case where chip circuits are desired to be tested for each of the electric transverse and magnetic transverse polarizations, for N different wavelengths, N being an integer in the range from 1 to 4. Such an alternative embodiment applies to the embodiment described in relation with FIG. 7.

The method described in relation with FIG. 5 may be adapted to the case where circuits of chip 5 are tested for N different wavelengths, for each of the electric transverse and magnetic transverse polarizations. For this purpose, states 52 and 53 are replaced with first, second, third, and fourth successive states. The first state comprises aligning the end of an optical fiber, having its other end coupled to a source of an electric transverse polarization signal at wavelength $\lambda i$, with the input $E_{TEi}$ adapted to this signal. The second state comprises applying this signal to input $E_{TEi}$. The third state comprises aligning the end of an optical fiber, having its other end coupled to a source of a magnetic transverse polarization signal at wavelength $\lambda i$, with the input $E_{TMi}$ adapted to this signal. The fourth state comprises applying this signal to input $E_{TMi}$.

As described in relation with FIG. 5, this method may be implemented by means of a single fiber or of a fiber array to decrease the number of alignment steps. For example, when a fiber of the array is aligned with an input $E_{TEi}$, another fiber of the array may be simultaneously aligned with input $E_{TMi}$.

As a variation, the first and second states may be exchanged with the third and fourth states, respectively.

In the embodiments and variations described hereabove in relation with FIGS. 1 to 8, when chip circuits are tested for at least two different wavelengths, it is preferably provided for the inputs of chip 5 adapted to these wavelengths to have adjacent passbands. In other words, it is provided for the maximum wavelength in the passband of an input to be equal to the minimum wavelength of the passband of another input, for example, to within 10%, preferably 5%, of the passband of one of these inputs. Thus, the circuits of chip 5 will be tested for a wide range of wavelengths. For example, in the implementation illustrated in FIG. 3, if inputs E1, E2, E3, and E4 have a bandwidth of approximately 20 nm, wavelengths $\lambda 2$, $\lambda 3$ and $\lambda 4$ are substantially equal respectively to $\lambda 1$ plus 20 nm, to $\lambda 1$ plus 40 nm, and to $\lambda 1$ plus 60 nm. The circuits may then be tested or characterized over a wavelength range having an extension substantially equal to 80 nm.

As a variation, the passbands of the chip inputs may partially overlap.

Further, the signal received by a given input of chip 5 may be at any wavelength selected from the passband of this input. Particularly, during the test at a given wavelength $\lambda i$, without changing input, signals at other wavelengths within the passband of this input may be applied thereto. This results in a more accurate test.

As an example, wavelengths λi are in the range from 1,250 to 1,360 nm. The waveguides formed on chip 5, in particular those of previously-described devices 1, 2, 3, and 4, are for example provided to transmit a signal having a wavelength substantially equal to 1,310 or 1,350 nm, such waveguides also enabling to transmit any other wavelength in the range from approximately 1,250 nm to approximately 1,360 nm, for example, with losses smaller than 3 dB, preferably 1 dB.

Preferably, as shown in FIGS. 1, 3, 4, 6, and 8, each of coupling devices 1, 3, and 4 is configured to have, between each of its outputs and each input of the chip to which it is connected, optical paths having substantially equal lengths crossing a same number of evanescent couplers. This enables the device to provide test signals having substantially equal powers. When such a device is implemented according to the embodiment of FIG. 2 or 7, it is preferably provided for all the outputs of evanescent coupler 1 (FIGS. 1 and 6), of the concerned evanescent couplers 33 (the two couplers 33 on the right-hand side of FIGS. 3 and 8), or of evanescent couplers 441, 442, 443, and 444 (FIG. 4) to be connected to identical optical splitters having their outputs then forming the outputs of the coupling device. In this case, each output of the coupling device provides a power signal substantially identical to that of the signal supplied by the other outputs of the device.

Although an example of a test chain comprising a single circuit to be tested with one optical input and one optical output has been described, the embodiments and their variations described hereabove also apply to different test chains. For example, a test chain comprising more than one calibrated or balanced optical splitter, possibly with more than two outputs, where the output of a first optical splitter may be coupled, preferably connected, to the input of a second optical splitter, may be provided. Further, a plurality of different circuits to be tested may be provided in a same test chain. Further, a circuit to be tested of a test chain may comprise a plurality of optical inputs and/or a plurality of optical outputs. A circuit to be tested of a test chain may be an optical circuit such as circuit DUT1, or an optoelectronic circuit, then comprising at least one input or one output adapted to an electronic signal. More generally, it will be within the abilities of those skilled in the art, based on the above indications, to provide any test chain where the ratio of the power of one or a plurality of optical signals provided to a circuit to be tested to that of a reference optical signal is known, so that the comparison of the output signal(s) of the circuit with the reference signal enables to determine whether the circuit is functional.

Specific embodiments have been described. Various alterations, modifications, and improvements will occur to those skilled in the art. In particular, although embodiments and alternative embodiments where the coupling devices comprise evanescent X couplers have been described, each of these evanescent couplers may be replaced with a coupler of multimode interferometer type (MMI) with two inputs and two outputs. More generally, an assembly of a plurality of evanescent X couplers and possible of one or a plurality of optical splitters 21 of a coupling device may be replaced with a MMI-type coupler, for example comprising more than two inputs and/or more than two outputs. For example, device 3 may be only formed with a MMI-type coupler with four inputs and four outputs, and device 2 such as shown in FIG. 2 may be implemented with only one MMI-type coupler with two inputs and six outputs. In the case where a MMI-type coupler replaces polarization-maintaining evanescent couplers and possibly one or a plurality of polarization-maintaining optical splitters, the MMI-type coupler is also polarization-maintaining.

Further, the above-described embodiments and variations thereof may be combined.

Further, the above-described embodiments and variations thereof also apply when the inputs of chip 5 are not grating couplers, but inputs having narrow bandwidths, for example, smaller than 50 nm, or even 25 nm, or even more 20 nm and/or adapted to a given polarization. As an example, these embodiments and their variations apply to the case where the chip inputs are arranged in a plane corresponding to the edge of the chip (edge coupling).

Although this has not been specified, the various elements, circuits, and devices of chip 5 may be formed from a portion of an SOI-type semiconductor layer, for example, made of silicon, resting on an insulating layer, itself resting on a support such as a semiconductor substrate.

It will be within the abilities of those skilled in the art based on the above description to form coupling devices of the type previously described, with any number of inputs greater than or equal to two and/or with any number of outputs.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of testing comprising:
   providing an optoelectronic chip comprising optical inputs, each optical input being adapted to one of a plurality of wavelengths;
   providing an optical coupler configured to couple the optical inputs to a plurality of outputs;
   providing a plurality of photonic circuits to be tested, each of the plurality of photonic circuits to be tested being configured to be coupled to one of the plurality of outputs of the optical coupler; and
   testing each of the plurality of photonic circuits to be tested to determine operation of the corresponding photonic circuit at the plurality of wavelengths.

2. The method of claim 1, wherein the testing comprises testing a first circuit of the plurality of photonic circuits, wherein testing the first circuit comprises
   applying a signal of a first wavelength to a first input of the optical inputs,
   coupling the signal to the first circuit through the optical coupler,
   determining an operation of the first circuit at the first wavelength, and
   repeating the applying, coupling, and determining for each of the remaining ones of the plurality of wavelengths until all of the plurality of wavelengths are applied to the first circuit.

3. The method of claim 2, wherein the testing comprises repeating the testing of the first circuit for each of the remaining ones of the plurality of photonic circuits.

4. The method of claim 1, further comprising:
aligning an array of optical fibers with the optical inputs, each optical fiber having one end coupled to a light source of one of the plurality of wavelengths.

5. The method of claim 4, wherein the array of optical fibers are held in place in a support.

6. The method of claim 1, wherein the optical inputs have different passbands.

7. The method of claim 6, wherein the passbands overlap partially.

8. The method of claim 6, wherein the different passbands are adjacent.

9. The method of claim 1, wherein the optical inputs have a same bandwidth and being each adapted to a different polarization.

10. The method of claim 1, wherein the optical coupler is of multimode interferometer type.

11. The method of claim 1, wherein the optical coupler is an evanescent coupler.

12. The method of claim 1, wherein the optical coupler comprises an optical splitter having an input coupled to the inputs of the optoelectronic chip and having an output coupled to one of the plurality of photonic circuits to be tested.

13. The method of claim 1, wherein the optical coupler is configured to provide, when an input of the chip receives a polarization signal adapted to this input of the chip, at a wavelength in the passband of this input of the chip, a signal of same wavelength and of same polarization to the photonic circuit to be tested.

14. A method of testing comprising:
aligning a optical coupler between an array of optical fibers and a plurality of photonic circuits to be tested, each optical fiber having one end coupled to a light source of one of a plurality of wavelengths, the aligning comprising aligning the array of optical fibers with one of the optical inputs of the optical coupler, the optical coupler being a multimode interferometer type or an evanescent coupler;
coupling each of the plurality of photonic circuits to one of the outputs of the optical coupler; and
testing each of the plurality of photonic circuits to be tested to determine operation of the corresponding photonic circuit at the plurality of wavelengths.

15. The method of claim 14, wherein the testing comprises testing a first circuit of the plurality of photonic circuits, wherein testing the first circuit comprises
applying a signal of a first wavelength to a first input of the optical inputs,
coupling the signal to the first circuit through the optical coupler,
determining an operation of the first circuit at the first wavelength, and
repeating the applying, coupling, and determining for each of the remaining ones of the plurality of wavelengths until all of the plurality of wavelengths are applied to the first circuit.

16. The method of claim 15, wherein the testing comprises repeating the testing of the first circuit for each of the remaining ones of the plurality of photonic circuits.

17. The method of claim 14, wherein the array of optical fibers are held in place in a support.

18. A method of testing comprising:
aligning a optical coupler between a plurality of optical fibers and a plurality of photonic circuits to be tested, each optical fiber having one end coupled to a light source of one of a plurality of wavelengths, the aligning comprising aligning the plurality of optical fibers with one of the optical inputs of the optical coupler, the optical inputs having different passbands;
coupling each of the plurality of photonic circuits to one of the outputs of the optical coupler; and
testing each of the plurality of photonic circuits to be tested to determine operation of the corresponding photonic circuit at the plurality of wavelengths.

19. The method of claim 18, wherein the passbands overlap partially.

20. The method of claim 18, wherein the different passbands are adjacent.

* * * * *